US008691409B2

(12) United States Patent
Shin et al.

(10) Patent No.: US 8,691,409 B2
(45) Date of Patent: Apr. 8, 2014

(54) BATTERY MODULE HAVING SENSING MEMBER WITH NOVEL STRUCTURE

(75) Inventors: Yong Shik Shin, Daejeon (KR); Jong Moon Yoon, Daejeon (KR); JaeHun Yang, Daejeon (KR); Jin Kyu Lee, Daejeon (KR); BumHyun Lee, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/570,776

(22) Filed: Aug. 9, 2012

(65) Prior Publication Data

US 2013/0078487 A1     Mar. 28, 2013

Related U.S. Application Data

(63) Continuation of application No. PCT/KR2011/002438, filed on Apr. 7, 2011.

(30) Foreign Application Priority Data

Apr. 8, 2010   (KR) ........................ 10-2010-0032111

(51) Int. Cl.
    *H01M 2/00*       (2006.01)
    *H01M 6/42*       (2006.01)
    *H01M 2/24*       (2006.01)
    *H01M 10/48*      (2006.01)

(52) U.S. Cl.
    USPC ................. 429/61; 429/62; 429/99; 429/159

(58) Field of Classification Search
    USPC ....................................... 429/99, 61, 62, 159
    See application file for complete search history.

(56) References Cited

U.S. PATENT DOCUMENTS

| 7,892,669 | B2 * | 2/2011 | Yang et al. | 429/99 X |
| 8,329,324 | B2 * | 12/2012 | Lee et al. | 429/61 |
| 8,455,122 | B2 * | 6/2013 | Shin et al. | 429/61 |
| 2009/0214936 | A1 | 8/2009 | Yang et al. | |

FOREIGN PATENT DOCUMENTS

| JP | 2009-529217 A | 8/2009 |
| KR | 10-2007-0091387 A | 9/2007 |
| KR | 10-2008-0027504 A | 3/2008 |

OTHER PUBLICATIONS

International Search Report for PCT/KR2011/002438 dated Nov. 21, 2011.

* cited by examiner

*Primary Examiner* — Kwang Han
(74) *Attorney, Agent, or Firm* — Birch, Stewart, Kolasch & Birch, LLP

(57) ABSTRACT

A battery module includes a battery cell stack having a plurality of battery cells or unit modules connected in series and/or in parallel to each other in a state in which the battery cells or the unit modules are stacked in the lateral direction. The battery cell stack is provided at the front thereof with bus bars to connect electrode terminals of the battery cells to external input and output terminals. Voltage sensing members are provided at ends thereof with connection terminals electrically connected to electrode terminal connection parts of the battery cells to sense voltages of the battery cells or the unit modules. An upper case is provided with mounting parts, in which the voltage sensing members are mounted. A lower case is coupled to the upper. The lower case is provided at the front thereof with external input and output terminals.

20 Claims, 7 Drawing Sheets ately provided to improve productivity and maintenance
BATTERY MODULE HAVING SENSING MEMBER WITH NOVEL STRUCTURE This application is a Bypass Continuation of PCT Application No. PCT/KR2011/002438 filed on Apr. 7, 2011, which claims priority under 35 U.S.C. §119(a) to Patent Application No. 10-2010-0032111 filed in the Republic of Korea on Apr. 8, 2010. The entire contents of each of the above documents is hereby incorporated by reference into the present application.

TECHNICAL FIELD

The present invention relates to a battery module having sensing members of a novel structure, and, more particularly, to a battery module including a battery cell stack having a plurality of battery cells or unit modules connected in series and/or in parallel to each other in a state in which the battery cells or the unit modules are stacked in the lateral direction, voltage sensing members provided at ends thereof with connection terminals electrically connected to electrode terminal connection parts of the battery cells disposed at the front and rear of the battery cell stack to sense voltages of the battery cells or the unit modules, an upper case provided with mounting parts, in which the voltage sensing members are mounted, and a lower case provided at the front thereof with external input and output terminals.

BACKGROUND ART

Recently, a secondary battery, which can be charged and discharged, has been widely used as an energy source for wireless mobile devices. Also, the secondary battery has attracted considerable attention as a power source for electric vehicles (EV), hybrid electric vehicles (HEY) and plug-in hybrid electric vehicles (Plug-in HEV), which have been developed to solve problems, such as air pollution, caused by existing gasoline and diesel vehicles using fossil fuels.

Small-sized mobile devices use one or several battery cells for each device. On the other hand, middle or large-sized devices, such as vehicles, use a battery module having a plurality of battery cells electrically connected to each other because high power and large capacity are necessary for the middle or large-sized devices.

Preferably, the battery module is manufactured so as to have as small a size and weight as possible. For this reason, a prismatic battery or a pouch-shaped battery, which can be stacked with high integration and has a small weight to capacity ratio, is usually used as a battery cell of a middle or large-sized battery module. In particular, much interest is currently focused on the pouch-shaped battery, which uses an aluminum laminate sheet as a sheathing member, because the pouch-shaped battery is lightweight and the manufacturing cost of the pouch-shaped battery is low.

Also, a plurality of battery cells is combined to constitute a battery module. When overvoltage, overcurrent or overheat occurs at some of the battery cells, therefore, safety and operating efficiency of the battery module are considerably deteriorated. For this reason, it is necessary to provide a unit to sense and control such overvoltage, overcurrent or overheat. Consequently, a voltage sensor is connected to the battery cells to confirm an operating state of the battery cells in real time or at predetermined intervals and control voltage of the battery cells. However, installation or connection of such a sensing unit very complicates an assembly process of the battery module. In addition, a short circuit may occur due to a plurality of wires used to install or connect the sensing unit.

Also, as the result of wide application of secondary batteries, the secondary batteries are used as a power source for vehicles. Consequently, it is necessary to provide a fixing unit to stably maintain a contact state of the sensing unit even when strong impact or vibration is applied to the sensing unit.

On the other hand, in a case in which a plurality of battery cells is used to constitute a battery module or a plurality of unit modules, each of which includes a predetermined number of battery cells, is used to constitute a battery module, it is generally necessary to provide a large number of members to achieve mechanical coupling and electrical connection between the battery cells or the unit modules. However, a process of assembling such members is very complicated.

Furthermore, it is necessary to provide a space in which the members are coupled, welded or soldered to achieve mechanical coupling and electrical connection between the battery cells or the unit modules. As a result, overall system size is increased. The increase of the size is not preferred as previously described. Consequently, there is a high necessity for a battery module which is more compact and exhibits high structural stability.

DISCLOSURE

Technical Problem

Therefore, the present invention has been made to solve the above problems, and other technical problems that have yet to be resolved.

Specifically, it is an object of the present invention to provide a battery module including voltage sensing members which can be manufactured using a simple assembly method without using a plurality of members to achieve mechanical coupling and electrical connection.

It is another object of the present invention to provide a battery module including voltage sensing members which are separately provided to improve productivity and maintenance of battery modules.

It is a further object of the present invention to provide a middle or large-sized battery pack, including battery modules, which is manufactured to have desired power and capacity.

Technical Solution

In accordance with one aspect of the present invention, the above and other objects can be accomplished by the provision of a battery module including (a) a battery cell stack having a plurality of battery cells or unit modules connected in series and/or in parallel to each other in a state in which the battery cells or the unit modules are stacked in the lateral direction, the battery cell stack being provided at the front thereof with bus bars to connect electrode terminals of the battery cells to external input and output terminals, (b) voltage sensing members provided at ends thereof with connection terminals electrically connected to electrode terminal connection parts of the battery cells disposed at the front and rear of the battery cell stack to sense voltages of the battery cells or the unit modules, (c) an upper case to cover the end of one side of the battery cell stack and portions of the top and bottom of the battery cell stack, the upper case being provided with mounting parts, in which the voltage sensing members are mounted, and (d) a lower case coupled to the upper case in a state in which the lower case covers the end of the other side of the battery cell stack and portions of the top and bottom of the battery cell stack, the lower case being provided at the front thereof with external input and output terminals.

In the battery module according to the present invention, the voltage sensing members are electrically connected to the electrode terminal connection parts of the battery cells disposed at the front and rear of the battery cell stack in a state in which the voltage sensing members are mounted in the mounting parts disposed at the front and rear of the upper case, and therefore, an assembly process of each of the voltage sensing members is very simple and each of the voltage sensing members has a compact structure to stably sense voltage.

Also, each of the voltage sensing members to sense voltage of the battery cells is configured to have a modular assembly structure. Consequently, the voltage sensing members can be easily mounted to the front or the rear of the battery module, by which a middle connection part of the voltage sensing structure is minimized, thereby improving reliability in voltage sensing.

In addition, the voltage sensing members, each of which is configured as a separate unit, can be manufactured with reduced manufacturing cost due to the simple structure thereof. Also, the voltage sensing members can be manufactured through outsourcing. Consequently, it is possible to greatly improve productivity of battery modules.

Also, when the voltage sensing members malfunction, only the voltage sensing members mounted to the front and rear of the battery module can be replaced without disassembly of the battery module, thereby greatly improving maintenance as compared with the structure of a conventional battery module.

Furthermore, the mounting parts, in which the voltage sensing members are mounted, are formed at the upper case. Consequently, it is possible to selectively mount the voltage sensing members to the battery module as needed after assembly of the battery module, and therefore, it is possible to configure the voltage sensing members to have a more compact structure than the structure of the conventional battery module in which the voltage sensing members are mounted in the lower case.

In a preferred example, at least some of the electrical connection portions of the battery cells are connected in series to each other in a unit module or at least some of the electrical connection portions of the battery cells in one unit module are connected in series to at least some of the electrical connection portions of the battery cells in another unit module. The electrode terminals of the battery cells are coupled to each other in a state in which the battery cells are arranged so that the electrode terminals of the battery cells are adjacent to each other, and a predetermined number of the battery cells are covered by cell covers to manufacture a plurality of unit modules. A sequence of the manufacturing process may be partially changed. For example, a plurality of unit modules may be individually manufactured and electrical connection between the unit modules may be performed.

The battery cell stack, in which the battery cells are stacked with high integration in a state in which the electrode terminals of the battery cells are connected to each other, is mounted in the upper and lower cases, which can be vertically separated and are coupled to each other in an assembly type coupling structure, in the vertical direction.

When the battery cell stack is mounted in the upper and lower cases and the upper and lower cases are coupled to each other, the upper and lower cases preferably cover only the edge of the battery cell stack so that opposite major surfaces of the battery cell stack are exposed to the outsides of the upper and lower cases to easily dissipate heat from the battery cell stack. As previously described, therefore, the upper case covers the end of one side of the battery cell stack and portions of the top and bottom of the battery cell stack, and the lower case covers the end of the other side of the battery cell stack and portions of the top and bottom of the battery cell stack.

In a battery module constituted by a plurality of unit modules, on the other hand, it is necessary to measure and control voltage in consideration of safety and operating efficiency of the battery module. In particular, it is necessary to measure voltage for each unit module or for each electrical connection part of the unit modules. However, the installation of such voltage sensing members further complicates the structure of the battery module.

In the battery module according to the present invention, the voltage sensing members are mounted in the mounting parts of the upper case, thereby solving the above-mentioned problem. That is, the voltage sensing members are mounted in the respective mounting parts located at the front and rear of the upper case.

Each of the battery cells may be, for example, a plate-shaped battery cell having electrode terminals formed at the upper and lower ends thereof.

The voltage sensing members are not particularly restricted so long as the voltage sensing members are electrically connected to the electrode terminal connection parts of the battery cells to easily sense voltages of the battery cells or the unit modules. In a preferred example, the voltage sensing members may include a front sensing member connected to the electrode terminal connection parts disposed at the front of the battery cell stack and a rear sensing member connected to the electrode terminal connection parts disposed at the rear of the battery cell stack.

Consequently, the front sensing member and the rear sensing member are mounted in the respective mounting parts of the upper case with the result that the front sensing member and the rear sensing member are easily electrically connected to the electrode terminal connection parts located at the front and rear of the battery cell stack.

Preferably, the front sensing member and the rear sensing member include main bodies, each of which is formed in the shape of a connector having a hollow structure, and connection terminals connected to series-connection bent regions (electrode terminal connection parts) of the electrode terminals of the battery cells in a state in which the connection terminals are fitted in the respective main bodies, respectively.

In an example of the above structure, the lower part of each of the main bodies may be formed to have a division type structure in which the connection terminals can be inserted into the main bodies for each of the electrode terminal connection parts. Consequently, the connection terminals of the voltage sensing members mounted in the lower part having the division type structure are easily electrically connected to the electrode terminal connection parts of the battery cells disposed at the front and rear of the battery cell stack.

The number of divided parts of the lower part of each of the main bodies of the front sensing member and the rear sensing member may be changed depending upon the number of the unit modules constituting the battery module, the structure in which the unit modules are connected in series and/or in parallel to each other or the shape of the bus bars. For example, in a case in which the battery cell stack includes four unit modules (eight battery cells) stacked in the lateral direction, the lower part of the main body of the front sensing member may be divided into three parts and the lower part of the main body of the rear sensing member may be divided into four parts so that the front sensing member and the rear sensing member can be connected to the electrode terminal connection parts disposed at the front and rear of the battery cell stack.

In another example of the above structure, each of the connection terminals may be formed to have a receptacle type structure in which each of the connection terminals is inserted into a corresponding one of the electrode terminal connection parts from above. Consequently, electrical connection between the connection terminals of the voltage sensing members and the electrode terminal connection parts of the battery cells is stably maintained even when external impact is applied to the battery module, which is preferable.

The mounting parts are formed at the front and rear of the upper case so that the mounting parts are upwardly open. After assembly of the battery module, therefore, the voltage sensing members are inserted into the respective mounting parts from above, thereby achieving electrical connection between the voltage sensing members and the electrode terminal connection parts, which is very preferable in assembly efficiency.

Meanwhile, the battery module may further include a battery module temperature sensor mounted between the battery cells or the unit modules to measure temperature of the battery module. In this case, it is possible to sense and control excessive increase of temperature, thereby effectively preventing the battery module from catching fire or exploding.

The battery module temperature sensor may be, for example, a thermistor.

According to circumstances, a plurality of battery modules may be provided to constitute a battery pack. In this case, the battery pack includes a plurality of battery module temperature sensors. The upper end of each of the battery module temperature sensors may protrude upward through a through hole of the upper case or downward through a through hole of the lower case to easily electrically connect the battery module temperature sensors.

Consequently, the battery module temperature sensor may be selectively inserted through the through hole of the upper case or the lower case based on the installation position of the battery module in a vehicle.

The lower case is provided at the front thereof with a pair of slits, through which the bus bars connected to the outermost electrode terminals of the battery cell stack are inserted. Consequently, the bus bars can be easily mounted to the lower case.

Each of the bus bars may include an electrode terminal connection part electrically connected to a corresponding one of the outermost electrode terminals of the battery module and an input and output terminal connection part connected to a corresponding one of the external input and output terminals of the lower case. The input and output terminal connection part may be perpendicularly bent from the electrode terminal connection part inwardly of the battery module.

Consequently, the bus bars with the above-stated construction may simultaneously connect the outermost electrode terminals of the battery module and the external input and output terminals of the lower case to each other, which is preferable.

In the above structure, the input and output terminal connection part of each of the bus bars may be provided at the lower part thereof with an inwardly depressed region, and each of the external input and output terminals may be fitted in the depressed region, thereby achieving electrical connection between each of the external input and output terminals and a corresponding one of the bus bars.

Consequently, it is possible to effectively prevent the bus bars from being dislocated after the bus bars are electrically connected to the external input and output terminals.

According to circumstances, the voltage sensing members, which are upwardly open, may be covered by insulative covers so that the voltage sensing members are isolated from the outside. The insulative covers to cover the respective voltage sensing members may be separately manufactured or integrally formed at the upper case.

Preferably, the battery cell stack includes a plurality of unit modules, each of which includes plate-shaped battery cells, each of which has electrode terminals formed at the upper end and the lower end thereof. Each of the unit modules may include two or more battery cells in which electrode terminals are connected in series and/or in parallel to each other and a pair of high-strength cell covers coupled to each other so as to cover the entirety of the outside of the battery cell stack excluding the electrode terminals of the battery cells.

The structure in which the electrode terminals are connected in series to each other is not particularly restricted so long as the electrode terminals can be easily electrically connected to each other. For example, the electrode terminals may be directly connected to each other by welding. Alternatively, the electrode terminals may be connected to each other via bus bars.

According to circumstances, additional terminals may be connected to the electrode terminals or the bus bars to improve reliability in repetitive use of the voltage sensing members. Meanwhile, the battery module according to the present invention is generally configured to have a compact structure. Also, structurally stable mechanical coupling and electrical connection are achieved without using a large number of members. In addition, a predetermined number, such as 4, 6, 8 or 10, of battery cells or unit modules constitute a battery module. Consequently, it is possible to effectively install a necessary number of battery modules in a limited space.

In accordance with another aspect of the present invention, therefore, there is provided a high power and capacity middle or large-sized battery pack manufactured using the battery module with the above-stated construction as a unit module.

In a preferred example, the middle or large-sized battery pack may include battery modules stacked in the lateral direction, and each of the battery modules may include voltage sensing members and a battery module temperature sensor.

In the structure of the battery pack, therefore, each of the battery modules may include a battery module temperature sensor to sense and control temperature of each of the battery module in addition to the battery module voltage sensing member to sense voltage of each of the battery module, thereby preventing the battery modules from catching fire or exploding, which is preferable in safety of the battery pack.

In another example, the voltage sensing members and the battery module temperature sensor may be connected to a battery management system (BMS) via wiring harness. Consequently, the BMS can easily control the battery pack based on voltage detection values input from the voltage sensing members and temperature measurement values input from the temperature sensors.

According to circumstances, the battery pack may further include an air temperature sensor to measure the temperature of air in a coolant introduction part.

Generally, the battery pack is configured to have a structure in which a coolant flows in the battery pack to cool the battery pack. In this case, the cooling efficiency of the battery pack is dependent upon the temperature of the coolant introduction part, and therefore, it is important to measure the temperature of the coolant introduction part. Consequently, the installation structure of the air temperature sensor as described above is very preferable in improving safety of the battery module.

The middle or large-sized battery pack according to the present invention may be manufactured by combining battery modules based on desired power and capacity. Also, the middle or large-sized battery pack according to the present invention is preferably used as a power source for electric vehicles, hybrid electric vehicles or plug-in hybrid electric vehicles, which have a limited installation space and are exposed to frequent vibration and strong impact in consideration of installation efficiency and structural stability as previously described.

BRIEF DESCRIPTION OF THE DRAWINGS

The above and other objects, features and other advantages of the present invention will be more clearly understood from the following detailed description taken in conjunction with the accompanying drawings, in which.

BEST MODE

Now, preferred embodiments of the present invention will be described in detail with reference to the accompanying drawings. It should be noted, however, that the scope of the present invention is not limited by the illustrated embodiments.

Figure 1:
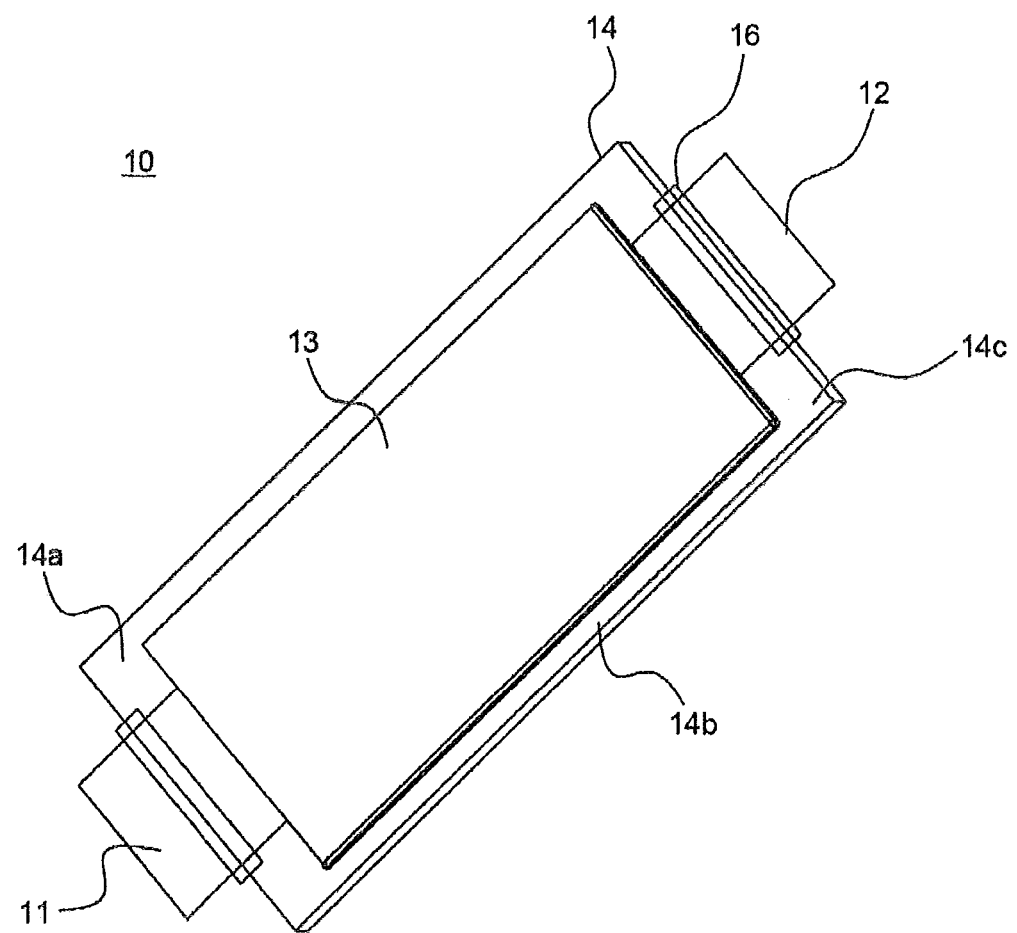
FIG. 1 is a perspective view of a plate-shaped battery cell, which will be mounted in a battery module.

FIG. 1 is a perspective view typically illustrating an exemplary plate-shaped battery cell, which will be mounted in a unit module according to the present invention.

Referring to FIG. 1, a plate-shaped battery cell 10 is configured to have a structure in which two electrode leads 11 and 12 protrude from the upper end and the lower end of a battery body 13, respectively, so that the electrode leads 11 and 12 are opposite to each other. A sheathing member 14 includes upper and lower sheathing parts. That is, the sheathing member 14 is a two-unit member. An electrode assembly (not shown) is mounted in a receiving part which is defined between the upper and lower sheathing parts of the sheathing member 14. Opposite sides 14b, an upper end 14a and a lower end 14c, which are contact regions of the upper and lower sheathing parts of the sheathing member 14, are bonded to each other, whereby the battery cell 10 is manufactured. The sheathing member 14 is configured to have a laminate structure of a resin layer/a metal foil layer/a resin layer. Consequently, it is possible to bond the opposite sides 14b and the upper and lower ends 14a and 14c of the upper and lower sheathing parts of the sheathing member 14, which are in contact with each other, to each other by applying heat and pressure to the opposite sides 14b and the upper and lower ends 14a and 14c of the upper and lower sheathing parts of the sheathing member 14 so as to weld the resin layers thereof to each other. According to circumstances, the opposite sides 14b and the upper and lower ends 14a and 14c of the upper and lower sheathing parts of the sheathing member 14 may be bonded to each other using a bonding agent. For the opposite sides 14b of the sheathing member 14, the same resin layers of the upper and lower sheathing parts of the sheathing member 14 are in direct contact with each other, whereby uniform sealing at the opposite sides 14b of the sheathing member 14 is accomplished by welding. For the upper end 14a and the lower end 14c of the sheathing member 14, on the other hand, the electrode leads 11 and 12 protrude from the upper end 14a and the lower end 14c of the sheathing member 14, respectively. For this reason, the upper and lower ends 14a and 14c of the upper and lower sheathing parts of the sheathing member 14 are thermally welded to each other, in a state in which a film type sealing member 16 is interposed between the electrode terminals 11 and 12 and the sheathing member 14, in consideration of the thickness of the electrode leads 11 and 12 and the difference in material between the electrode leads 11 and 12 and the sheathing member 14, so as to improve sealability of the sheathing member 14.

Figure 2:
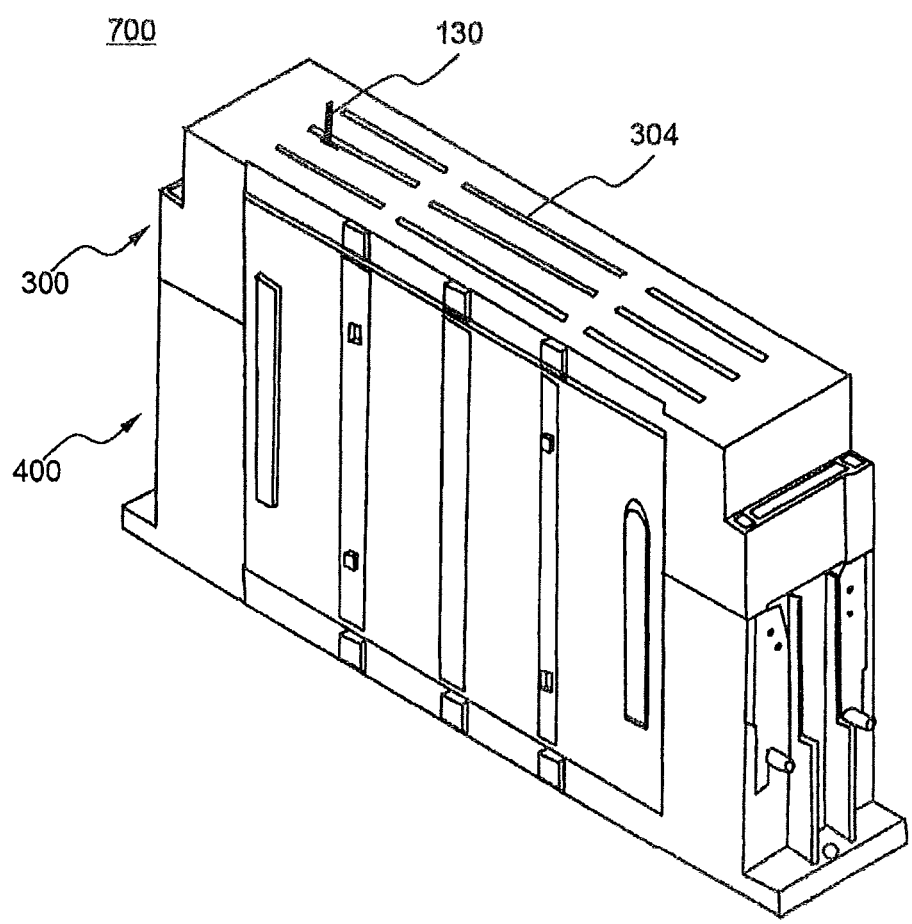
FIG. 2 is a perspective view of a battery module according to an embodiment of the present invention.
Figure 3:
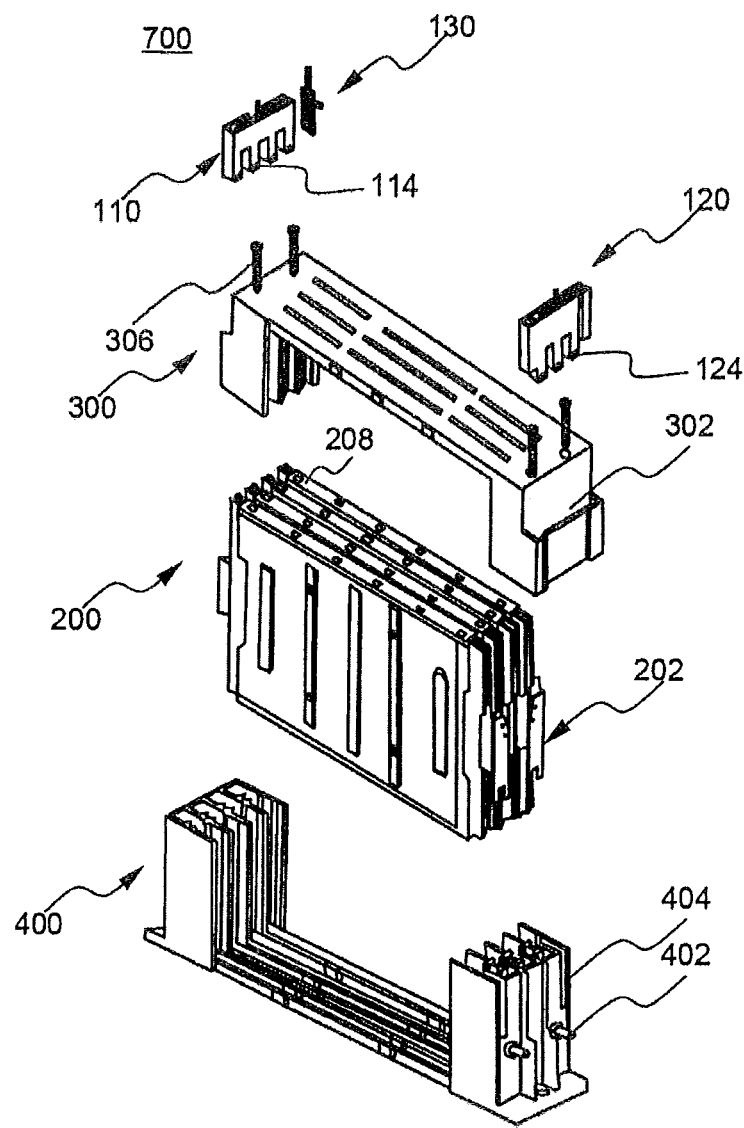
FIG. 3 is a typical exploded view of the battery module of FIG. 2.

FIG. 2 is a perspective view typically illustrating a battery module according to an embodiment of the present invention and FIG. 3 is a typical exploded view of the battery module of FIG. 2.

Figure 4:
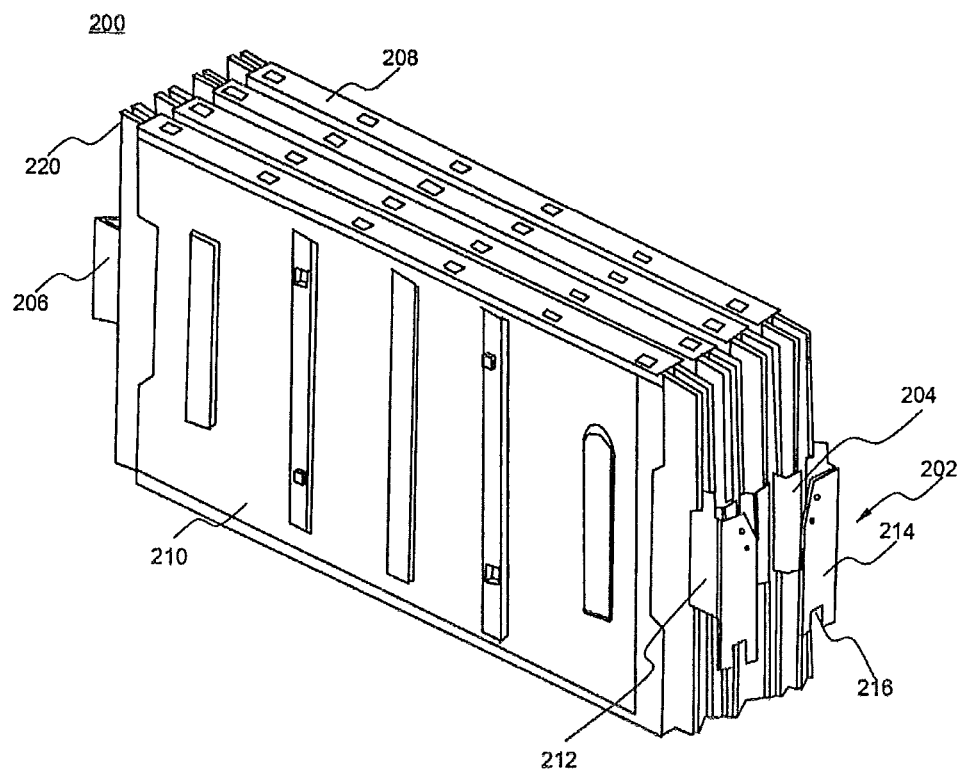
FIG. 4 is a perspective view illustrating a battery cell stack of the battery module of FIG. 3.

Referring to these drawings together with FIG. 4, a battery module 700 includes a battery cell stack 200, voltage sensing members 110 and 120, an upper case 300 and a lower case 400.

The battery cell stack 200 includes four unit modules 208 connected in series to each other in a state in which the unit modules 208 are stacked in the lateral direction, and bus bars 202 to connect electrode terminals of battery cells 220 to external input and output terminals 402 of the lower case 400 are provided at the front of the battery cell stack 400.

The voltage sensing members 110 and 120 are provided at the lower ends thereof with connection terminals 114 and 124 electrically connected to electrode terminal connection parts 204 and 206 of the unit modules disposed at the front and rear of the battery cell stack 200 to sense voltages of the unit modules 208.

The voltage sensing members 110 and 120 include a front sensing member 120 electrically connected to the electrode terminal connection parts 204 disposed at the front of the battery cell stack 200 and a rear sensing member 110 electrically connected to the electrode terminal connection parts 206 disposed at the rear of the battery cell stack 200.

The upper case 300 covers the end of one side of the battery cell stack 200 and portions of the top and bottom of the battery cell stack 200. The upper case 300 is provided at the front and rear thereof with voltage sensing member mounting parts 302, in which the voltage sensing members 110 and 120 are mounted, respectively.

The lower case 400 is coupled to the upper case 300 by bolts 306 in a state in which the lower case 600 covers the end of the other side of the battery cell stack 200 and portions of the top and bottom of the battery cell stack 200. The lower case 400 is provided at the front thereof with external input and output terminals 402.

Furthermore, the battery module 700 according to the present invention is configured to have a structure in which the battery cell stack 200 is mounted in the lower case 400, the upper case 300 is coupled to the lower case 400 by the bolts 306, and the voltage sensing members 110 and 120 are mounted in the voltage sensing member mounting parts 302 of the upper case 300. Consequently, only the voltage sensing members 110 and 120 can be replaced without disassembly of the battery module 700 when the voltage sensing members 110 and 120 malfunction, thereby greatly improving maintenance, as compared with the structure of a conventional battery module in which the voltage sensing members are mounted to the lower case and the upper case is coupled to the lower case by the bolts.

Also, a battery module temperature sensor 130, e.g. a thermistor, to measure temperature of the battery module 700 is mounted between the unit modules 208. The upper end of the battery module temperature sensor 130 protrudes upward through a through hole 304 of the upper case 300.

When the battery module temperature sensor 130 malfunction, therefore, only the battery module temperature sensor 130 can be replaced without disassembly of the battery module 700, thereby greatly improving maintenance as compared with the structure of the conventional battery module.

FIG. 4 is a perspective view typically illustrating the battery cell stack of the battery module of FIG. 3.

Referring to FIG. 4 together with FIG. 3, the battery cell stack 200 includes four unit modules 208. Each of the unit modules 208 includes two plate-shaped battery cells 220, each of which has electrode terminals formed at the upper end and the lower end thereof, respectively.

Each of the unit modules 208 includes two battery cells 220 in which electrode terminals are connected in series to each other and a connection part 204 between the electrode terminals is bent so that the battery cells 200 are arranged in a stacked structure and a pair of high-strength cell covers 210 coupled to each other so as to cover the entirety of the outside of the battery cell stack 200 excluding the electrode terminals of the battery cells 220.

Each of the bus bars 202 includes an electrode terminal connection part 212 electrically connected to a corresponding one of the outermost electrode terminals of the battery module 700 and an input and output terminal connection part 214 electrically connected to a corresponding one of the external input and output terminals 402 of the lower case 400.

The input and output terminal connection part 214 is perpendicularly bent from the electrode terminal connection part 212 inwardly of the battery module 700. Also, the input and output terminal connection part 214 is provided at the lower part thereof with an inwardly depressed region 216. Each of the external input and output terminals 402 of the lower case 400 is fitted in the depressed region 216 of a corresponding one of the input and output terminal connection parts 214, thereby achieving electrical connection between each of the external input and output terminals 402 and a corresponding one of the bus bars 202.

Figure 5:
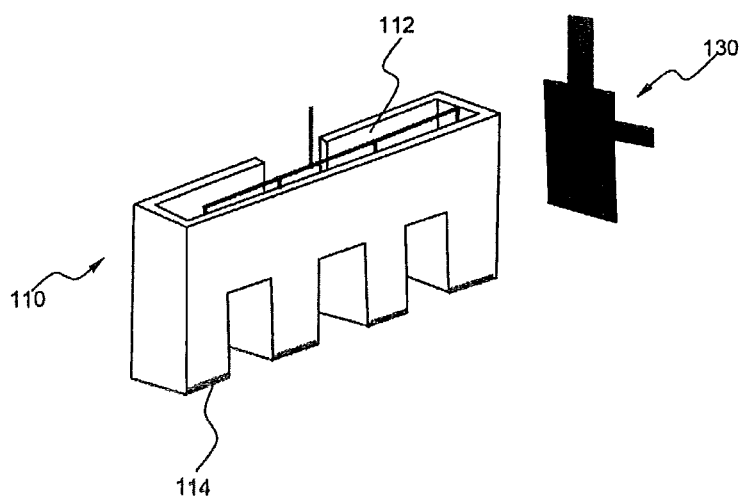
FIG. 5 is a perspective view illustrating a rear sensing member and a battery module temperature sensor of the battery module of FIG. 3.
Figure 6:
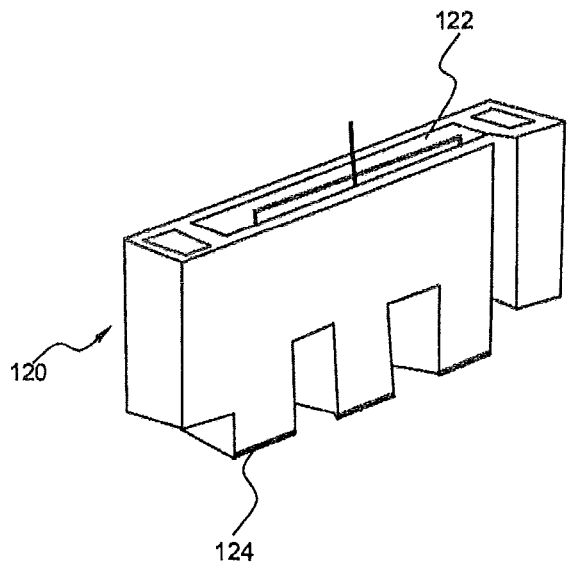
FIG. 6 is a perspective view illustrating a front sensing member of the battery module of FIG. 3.

FIG. 5 is a perspective view typically illustrating the rear sensing member and the battery module temperature sensor of the battery module of FIG. 3, and FIG. 6 is a perspective view typically illustrating the front sensing member of the battery module of FIG. 3.

Referring to these drawings together with FIG. 4, the front sensing member 120 and the rear sensing member 110 include main bodies 122 and 112, each of which is formed in the shape of a connector having a hollow structure, and connection terminals 124 and 114 connected to the series-connection bent regions (electrode terminal connection parts) of the electrode terminals of the battery cells in a state in which the connection terminals 124 and 114 are fitted in the respective main bodies 122 and 112, respectively. That is, the ends of the connection terminals 114 and 124 are exposed to the outside through the lower ends of the main bodies 112 and 122 in a state in which the connection terminals 114 and 124 are fitted in the main bodies 112 and 122.

Also, the lower part of each of the main bodies 112 and 122 is formed to have a division type structure in which the connection terminals 114 and 124 can be inserted into the main bodies 112 and 122 for each of the electrode terminal connection parts 204 of the battery cell stack 200. Each of the connection terminals 114 and 124 is formed to have a receptacle type structure in which each of the connection terminals 114 and 124 is inserted into a corresponding one of the electrode terminal connection parts from above.

The lower part of the main body 122 of the front sensing member 120 is divided into three parts, to which the electrode terminal connection parts 204 located at the front of the battery cell stack 220 are connected. The lower part of the main body 112 of the rear sensing member 110 is divided into four parts, to which the electrode terminal connection parts 206 located at the rear of the battery cell stack 220 are connected.

Figure 7:
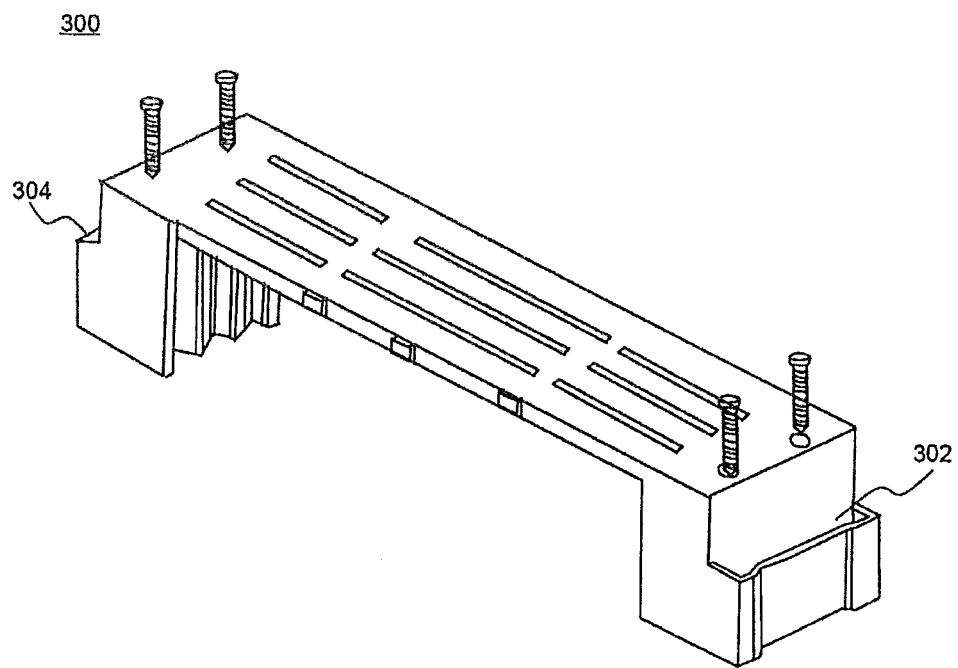
FIG. 7 is a perspective view illustrating an upper case of the battery module of FIG. 3.
Figure 8:
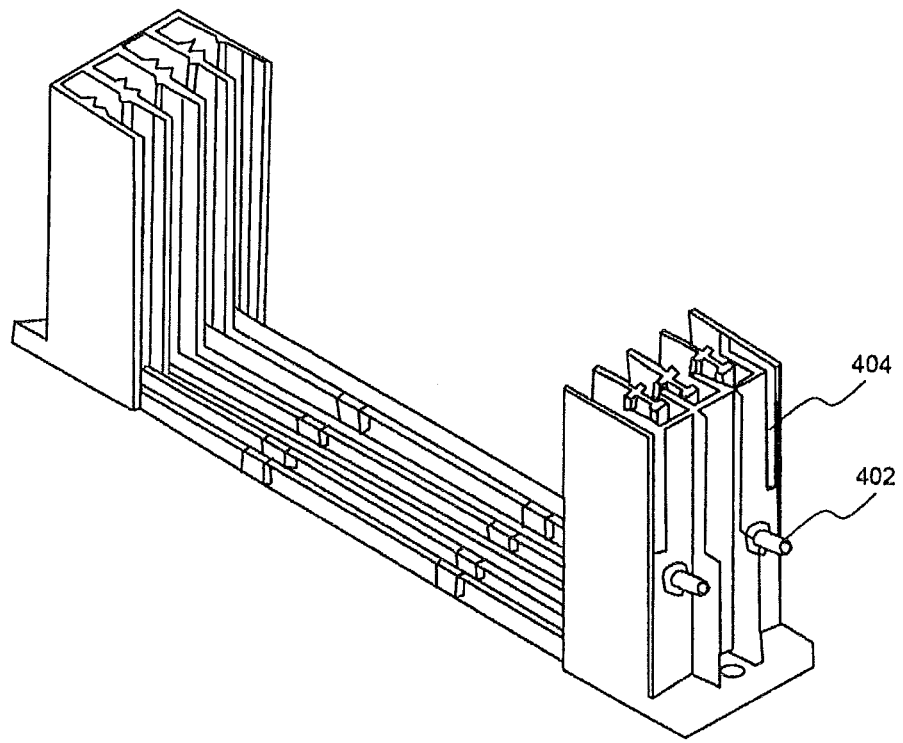
FIG. 8 is a perspective view illustrating a lower case of the battery module of FIG. 3.

FIG. 7 is a perspective view typically illustrating the upper case of the battery module of FIG. 3, and FIG. 8 is a perspective view typically illustrating the lower case of the battery module of FIG. 3.

Referring to these drawings together with FIG. 3, the voltage sensing member mounting parts 302, in which the voltage sensing members 110 and 120 are mounted, are formed at the front and rear of the upper case 300 so that the voltage sensing member mounting parts 302 are upwardly open.

Also, the lower case 400 is provided at the front thereof with a pair of slits 404, through which the bus bars 202 electrically connected to the outermost electrode terminals of the battery cell stack are inserted.

Figure 9:
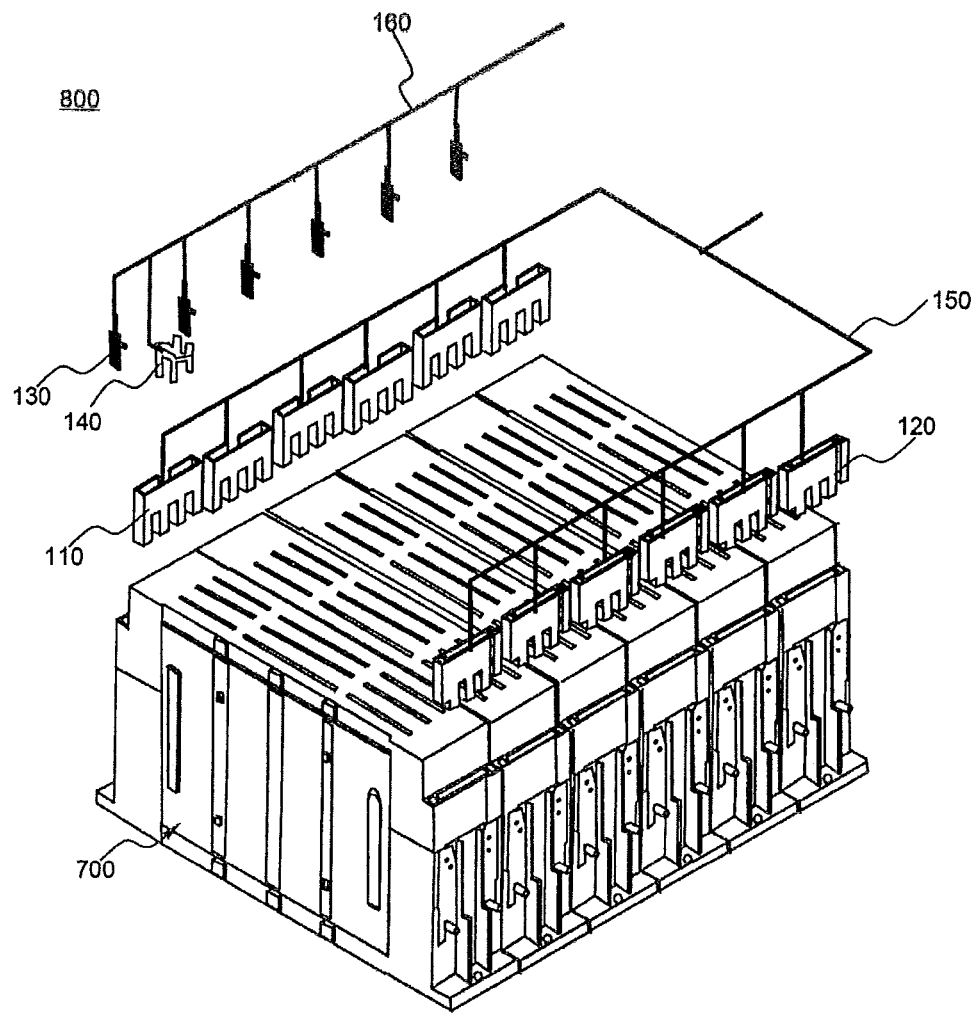
FIG. 9 is a perspective view of a middle or large-sized battery pack according to another embodiment of the present invention.

FIG. 9 is a perspective view typically illustrating a middle or large-sized battery pack according to another embodiment of the present invention.

Referring to FIG. 9, the battery pack 800 includes a plurality of battery modules 700 stacked in the lateral direction. Each of the battery modules 700 includes voltage sensing members 110 and 120 and a battery module temperature sensor 130.

Also, the voltage sensing members 110 and 120 and the battery module temperature sensor 130 are electrically connected to a battery management system (BMS) (not shown) via wiring harness 150 and 160.

The wiring harness 150 and 160 are disposed above the battery pack 800. when external force, such as vibration generated from a vehicle, is applied to the battery pack 800, therefore, the wiring harness 150 and 160 are effectively prevented from being damaged by the battery pack 800.

In addition, the battery pack 800 includes an air temperature sensor 140 to measure the temperature of air in a coolant introduction part of the battery pack 800. Consequently, it is possible to measure the temperature of air in the coolant introduction part as well as the temperatures of the respective battery modules 700

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As is apparent from the above description, each of the voltage sensing members according to the present invention can be manufactured using a simple assembly method without using a plurality of members to achieve mechanical coupling and electrical connection. Consequently, it is possible to reduce manufacturing cost of each of the voltage sensing members. Also, it is possible to stably sense voltage even when strong external impact or vibration is applied to the voltage sensing members.

Also, each of the voltage sensing members according to the present invention can be separately provided, thereby greatly improving productivity of battery modules and maintenance of battery modules.

In addition, the battery module including the voltage sensing members according to the present invention can be used as a unit module to easily manufacture a middle or large-sized battery pack having desired power and capacity.

The invention claimed is:

1. A battery module comprising:
   (a) a battery cell stack having a plurality of battery cells or unit modules connected in series or in parallel to each other, or a plurality of battery cells or unit modules connected in series and in parallel to each other in a state in which the battery cells or the unit modules are stacked in the lateral direction, the battery cell stack being provided at the front thereof with bus bars to connect electrode terminals of the battery cells to external input and output terminals;
   (b) voltage sensing members provided at ends thereof with connection terminals electrically connected to electrode terminal connection parts of the battery cells disposed at the front and rear of the battery cell stack to sense voltages of the battery cells or the unit modules;
   (c) an upper case to cover the end of one side of the battery cell stack and portions of the top and bottom of the battery cell stack, the upper case being provided with mounting parts, in which the voltage sensing members are mounted; and
   (d) a lower case coupled to the upper case in a state in which the lower case covers the end of the other side of the battery cell stack and portions of the top and bottom of the battery cell stack, the lower case being provided at the front thereof with external input and output terminals.

2. The battery module according to claim 1, wherein each of the battery cells is a plate-shaped battery cell having electrode terminals formed at the upper and lower ends thereof.

3. The battery module according to claim 1, wherein the voltage sensing members comprise a front sensing member connected to the electrode terminal connection parts disposed at the front of the battery cell stack and a rear sensing member connected to the electrode terminal connection parts disposed at the rear of the battery cell stack.

4. The battery module according to claim 3, wherein the front sensing member and the rear sensing member comprise main bodies, each of which is formed in the shape of a connector having a hollow structure, and connection terminals connected to the electrode terminal connection parts of the battery cells in a state in which the connection terminals are fitted in the respective main bodies, respectively.

5. The battery module according to claim 4, wherein the lower part of each of the main bodies is formed to have a division type structure in which the connection terminals can be inserted into the main bodies for each of the electrode terminal connection parts.

6. The battery module according to claim 5, wherein the lower part of the main body of the front sensing member is divided into three parts and the lower part of the main body of the rear sensing member is divided into four parts.

7. The battery module according to claim 4, wherein each of the connection terminals is formed to have a receptacle type structure in which each of the connection terminals is inserted into a corresponding one of the electrode terminal connection parts from above.

8. The battery module according to claim 1, wherein the mounting parts are formed at the front and rear of the upper case so that the mounting parts are upwardly open.

9. The battery module according to claim 1, further comprising a battery module temperature sensor mounted between the battery cells or the unit modules to measure temperature of the battery module.

10. The battery module according to claim 9, wherein the battery module temperature sensor is a thermistor.

11. The battery module according to claim 9, wherein the upper end of the battery module temperature sensor protrudes upward through a through hole of the upper case or downward through a through hole of the lower case.

12. The battery module according to claim 1, wherein the lower case is provided at the front thereof with a pair of slits, through which the bus bars connected to the outermost electrode terminals of the battery cell stack are inserted.

13. The battery module according to claim 1, wherein each of the bus bars comprises an electrode terminal connection part electrically connected to a corresponding one of the outermost electrode terminals of the battery module and an input and output terminal connection part connected to a corresponding one of the external input and output terminals of the lower case, the input and output terminal connection part being perpendicularly bent from the electrode terminal connection part inwardly of the battery module.

14. The battery module according to claim 13, wherein the input and output terminal connection part is provided at the lower part thereof with an inwardly depressed region, and each of the external input and output terminals is fitted in the depressed region, thereby achieving electrical connection between each of the external input and output terminals and a corresponding one of the bus bars.

15. The battery module according to claim 1, wherein the voltage sensing members, which are upwardly open, are covered by insulative covers so that the voltage sensing members are isolated from the outside.

16. The battery module according to claim 1, wherein
   the battery cell stack comprises a plurality of unit modules, each of which comprises plate-shaped battery cells, each of which has electrode terminals formed at the upper end and the lower end thereof, and
   each of the unit modules comprises two or more battery cells in which electrode terminals are connected in series or in parallel to each other, or two or more battery cells in which electrode terminals are connected in series and in parallel to each other and a pair of cell covers coupled to each other so as to cover the entirety of the outside of the battery cell stack excluding the electrode terminals of the battery cells.

17. A battery pack manufactured using a battery module according claim 1 as a unit module.

18. The battery pack according to claim 17, wherein the battery pack comprises battery modules stacked in the lateral direction, and each of the battery modules comprises voltage sensing members and a battery module temperature sensor.

19. The battery pack according to claim 18, wherein the voltage sensing members and the battery module temperature sensor are connected to a battery management system (BMS) via wiring harness.

20. The battery pack according to claim 18, wherein the battery pack further comprises an air temperature sensor to measure the temperature of air in a coolant introduction part.

\* \* \* \* \*